(12) United States Patent
Ueno (10) Patent No.: US 12,438,292 B2
(45) Date of Patent: Oct. 7, 2025

(54) ELECTRONIC DEVICE (71) Applicant: SEIKO EPSON CORPORATION, Tokyo (JP)

(72) Inventor: Hitoshi Ueno, Shiojiri (JP)

(73) Assignee: SEIKO EPSON CORPORATION (JP)

(*) Notice: Subject to any disclaimer, the term of this patent is extended or adjusted under 35 U.S.C. 154(b) by 193 days.

(21) Appl. No.: 18/506,538

(22) Filed: Nov. 10, 2023

(65) Prior Publication Data
US 2024/0162637 A1 May 16, 2024

(30) Foreign Application Priority Data
Nov. 11, 2022 (JP) ................. 2022-180841

(51) Int. Cl.
H01R 12/57 (2011.01)
H05K 1/18 (2006.01)
G01C 19/5783 (2012.01)

(52) U.S. Cl.
CPC .......... H01R 12/57 (2013.01); H05K 1/181 (2013.01); G01C 19/5783 (2013.01); H05K 2201/10151 (2013.01); H05K 2201/1034 (2013.01); H05K 2201/10378 (2013.01); H05K 2201/10454 (2013.01); H05K 2201/10522 (2013.01); H05K 2201/10545 (2013.01)

(58) Field of Classification Search
CPC ............. H01R 12/57; H05K 1/181; H05K 2201/10151; G01C 19/5783
USPC .......................................... 361/760
See application file for complete search history.

(56) References Cited

U.S. PATENT DOCUMENTS

2009/0065486 A1* 3/2009 Yamashita ........ H01L 21/31662
219/121.58
2021/0378098 A1* 12/2021 Brazzle ................ H01L 25/167
2022/0085004 A1 3/2022 Kazuno et al.

FOREIGN PATENT DOCUMENTS

JP 2022-046922 A 3/2022

* cited by examiner

Primary Examiner — Andargie M Aychillhum
(74) Attorney, Agent, or Firm — Harness, Dickey & Pierce, P.L.C.

(57) ABSTRACT

An electronic device includes a substrate having a first surface and a second surface in a front-back relation, a first electronic component mounted on the second surface, and a lead joined to the second surface of the substrate via a conductive joint member, wherein the lead includes a base end portion extending in a direction along the substrate and joined to the second surface via the joint member, a distal end portion located distally from the substrate with respect to the base end portion in a thickness direction of the substrate and having a terminal surface, and a coupling portion coupling the base end portion and the distal end portion, and θ1>θ2, wherein, as seen from a direction orthogonal to a plane along which the lead extends, an angle formed by a line connecting an outermost position in which the joint member contacts the base end portion and an outer edge of the substrate and the base end portion is θ1, a distance between the first electronic component and the terminal surface in the thickness direction of the substrate is d1, a distance between a boundary part between the base end portion and the coupling portion and the joint member in the direction along the substrate is d2, and arctan(d1/d2)=θ2.

6 Claims, 12 Drawing Sheets

ELECTRONIC DEVICE

The present application is based on, and claims priority from JP Application Serial Number 2022-180841, filed Nov. 11, 2022, the disclosure of which is hereby incorporated by reference herein in its entirety.

BACKGROUND

1. Technical Field

The present disclosure relates to an electronic device.

2. Related Art

An electronic device disclosed in JP-A-2022-046922 includes a substrate, three angular velocity sensors joined to an upper surface of the substrate, an acceleration sensor joined to a lower surface of the substrate 2, a lead group having a plurality of leads joined to the lower surface of the substrate, a cap placed on the substrate to cover the respective angular velocity sensors, and a mold portion mold-sealing the acceleration sensor and joining the cap to the substrate.

However, in the electronic device in JP-A-2022-046922, the mold portion is provided, and the substrate may warp due to stress generated by moisture absorption and expansion of the mold portion and detection characteristics of the respective sensors mounted on the substrate may be degraded. Further, a microscopic gap may not sufficiently be filled with a molding material and an electrical continuity failure may be caused. To prevent the problems, it is considered that the mold portion is omitted from the electronic device in JP-A-2022-046922.

However, when the mold portion is omitted from the electronic device in JP-A-2022-046922, base end portions of the leads are not fixed by the mold portion, the leads may be deformed by an impact or the like and contact the substrate and the leads and the substrate may be broken.

SUMMARY

An electronic device according to an aspect of the present disclosure includes a substrate having a first surface and a second surface in a front-back relation with each other, a first electronic component mounted on the second surface, and a lead located at the second surface side of the substrate and joined to the second surface via a conductive joint member, wherein the lead includes a base end portion extending in a direction along the substrate and joined to the second surface via the joint member, a distal end portion located distally from the substrate with respect to the base end portion in a thickness direction of the substrate and having a terminal surface, and a coupling portion coupling the base end portion and the distal end portion, and θ1>θ2, wherein, as seen from a direction orthogonal to a plane along which the lead extends, an angle formed by a line connecting an outermost position in which the joint member contacts the base end portion and an outer edge of the substrate and the base end portion is θ1, a distance between the first electronic component and the terminal surface in the thickness direction of the substrate is d1, a distance between a boundary part between the base end portion and the coupling portion and the joint member in the direction along the substrate is d2, and arctan(d1/d2)=θ2.

DESCRIPTION OF EMBODIMENTS

As below, an electronic device of the present disclosure will be explained in detail based on embodiments shown in the accompanying drawings. Note that, for convenience of explanation, in the respective drawings, three axes orthogonal to one another are shown as an X-axis, a Y-axis, and a Z-axis. Directions parallel to the X-axis are also referred to as "X-axis directions", directions parallel to the Y-axis are also referred to as "Y-axis directions", and directions parallel to the Z-axis are also referred to as "Z-axis directions". Further, the Z-axis extends along a vertical direction and the plus side in the Z-axis direction is also referred to as "upper" and the minus side in the Z-axis direction is also referred to as "lower".

First Embodiment

Figure 1:
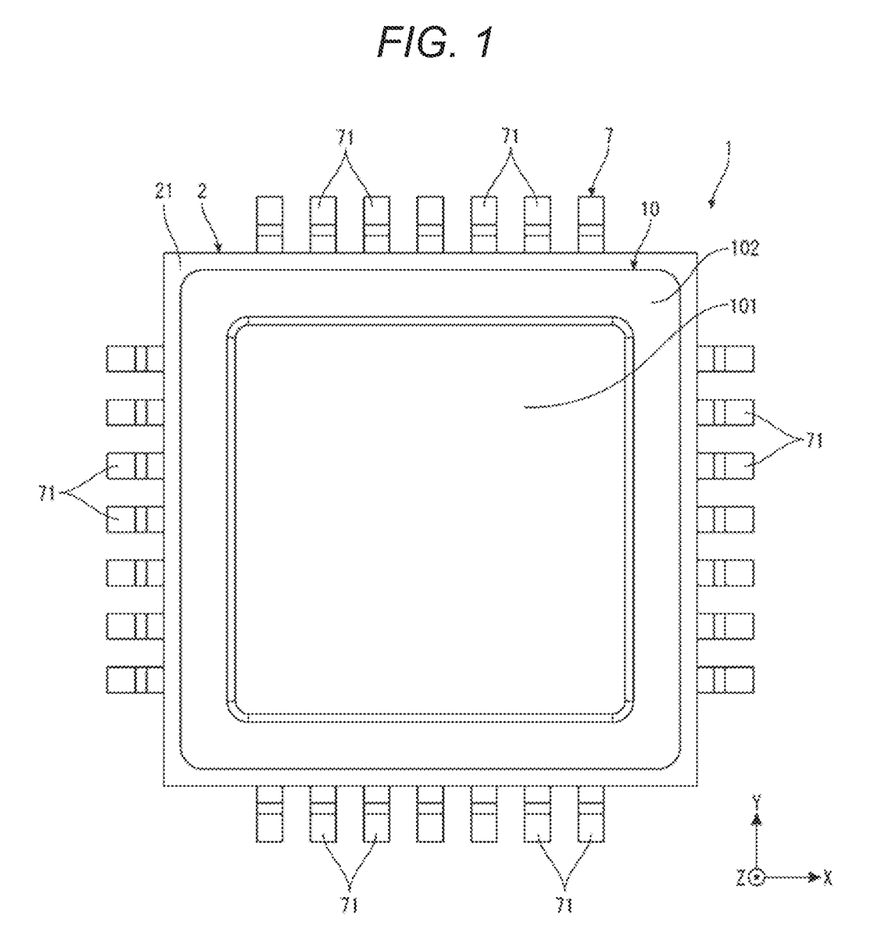
FIG. 1 is a top view of an electronic device according to a first embodiment.
Figure 2:
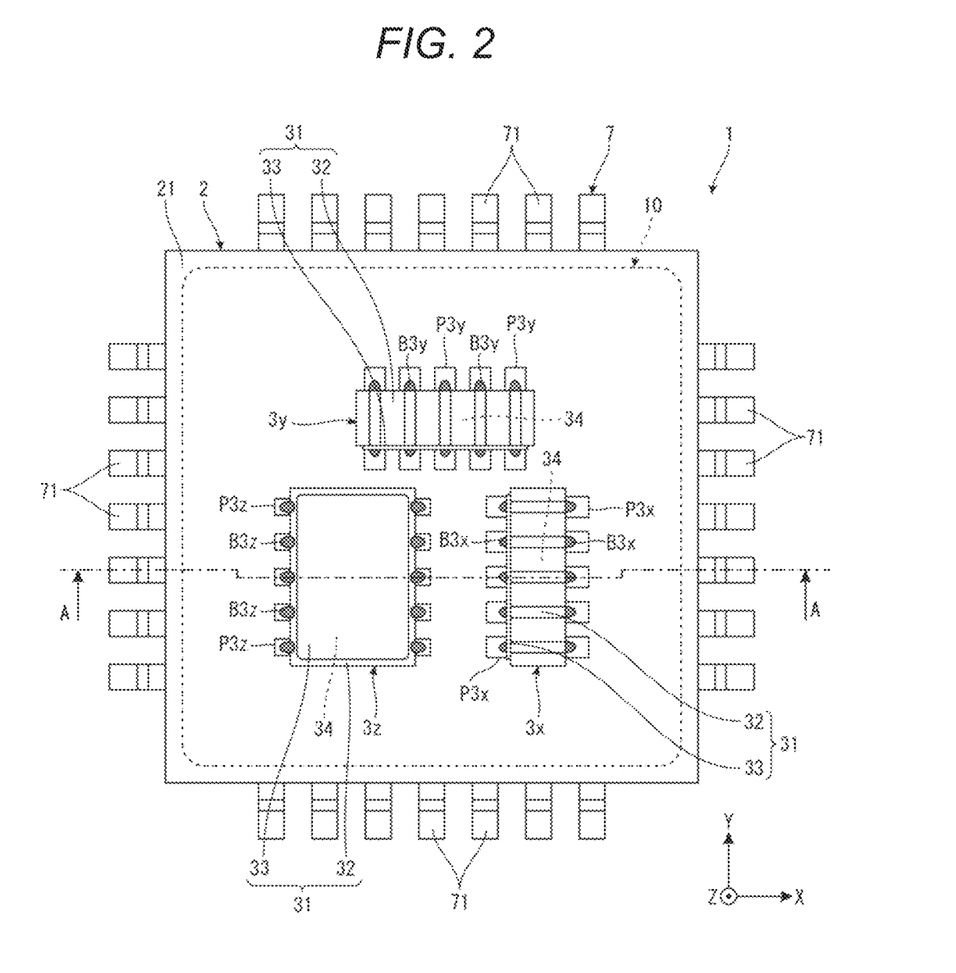
FIG. 2 is a top view of the electronic device from which a cap is omitted.
Figure 3:
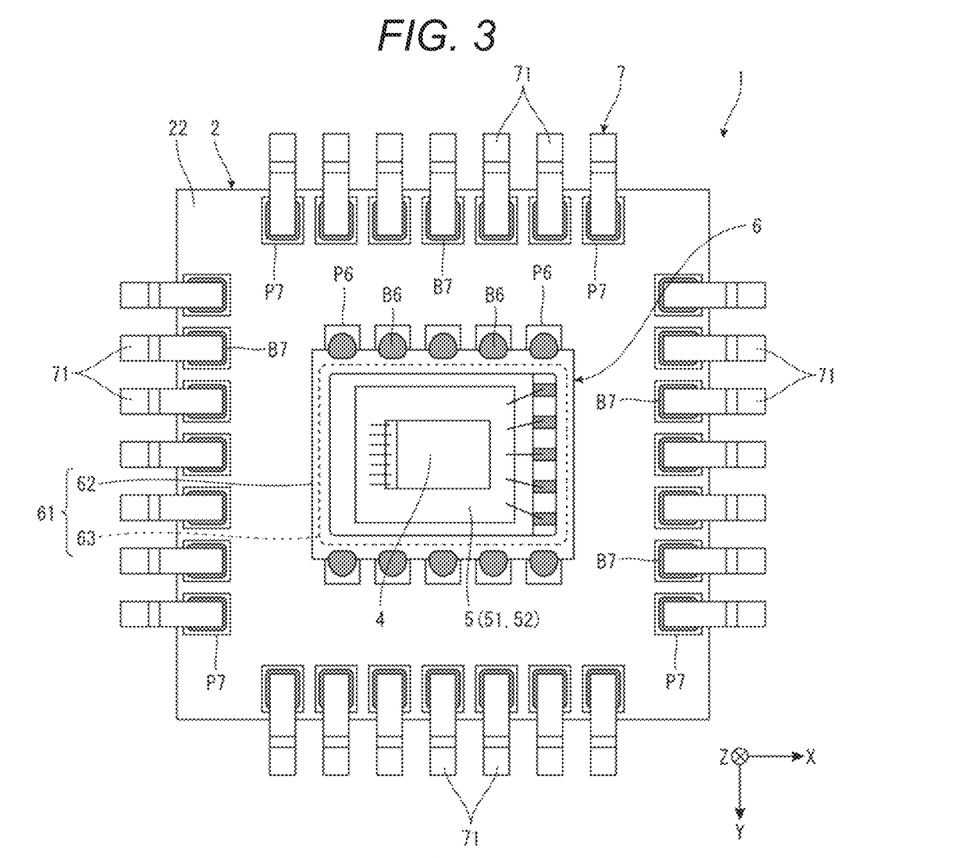
FIG. 3 is a bottom view of the electronic device.
Figure 4:
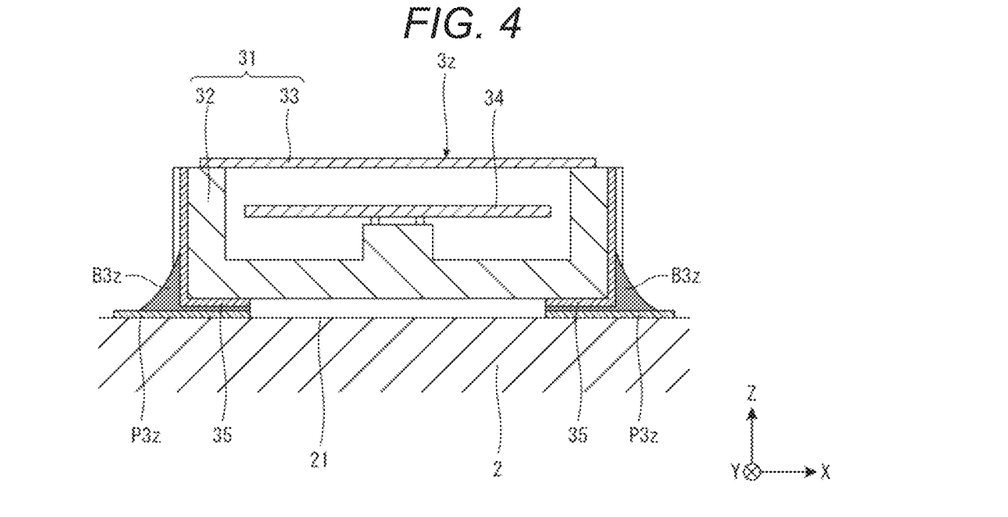
FIG. 4 is a sectional view of a second electronic component.
Figure 5:
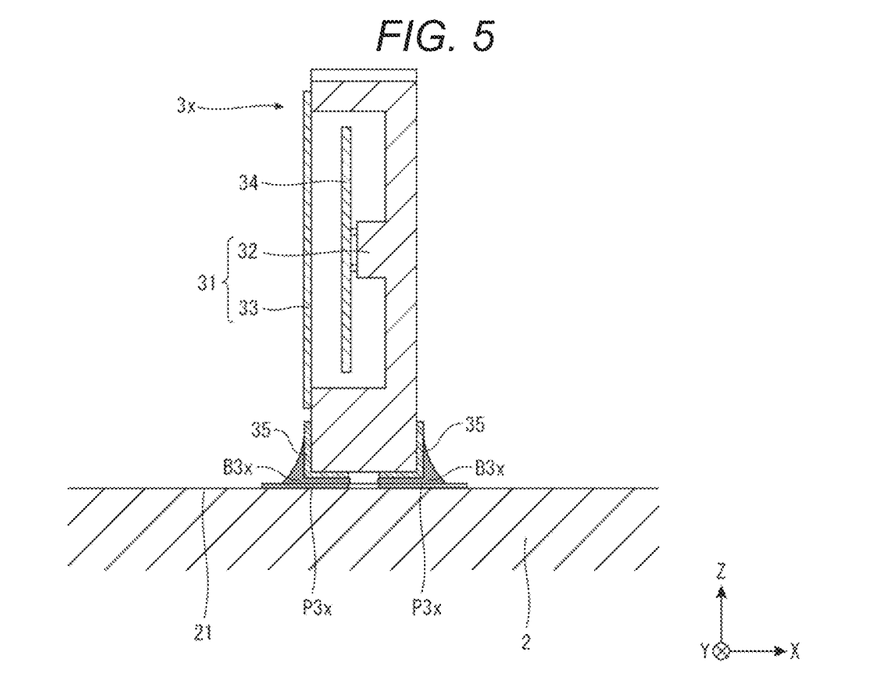
FIG. 5 is a sectional view of a third electronic component.
Figure 6:
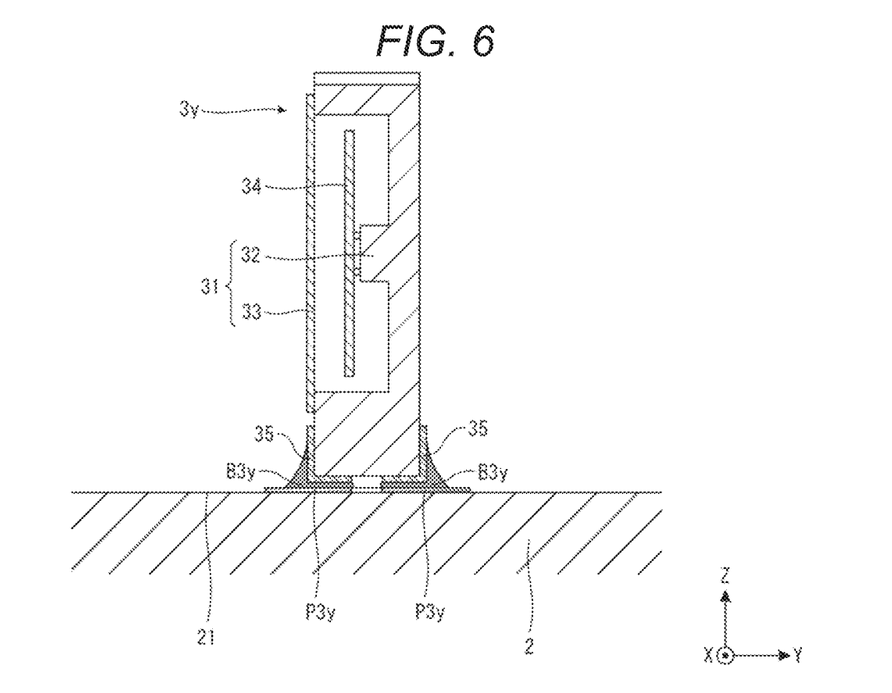
FIG. 6 is a sectional view of a fourth electronic component.
Figure 7:
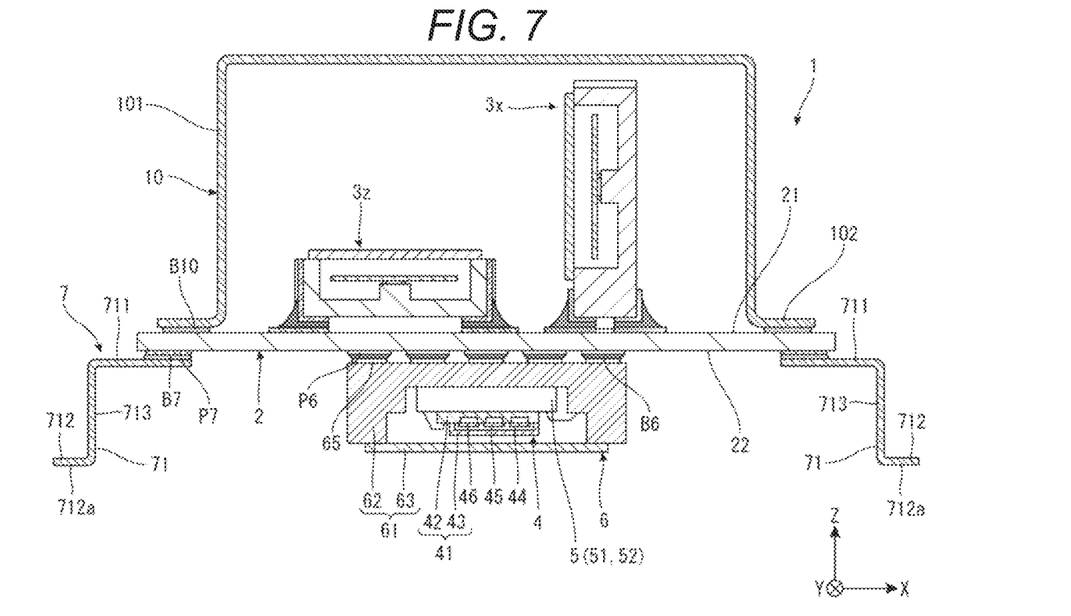
FIG. 7 is a sectional view along line A-A in FIG. 2.
Figure 8:
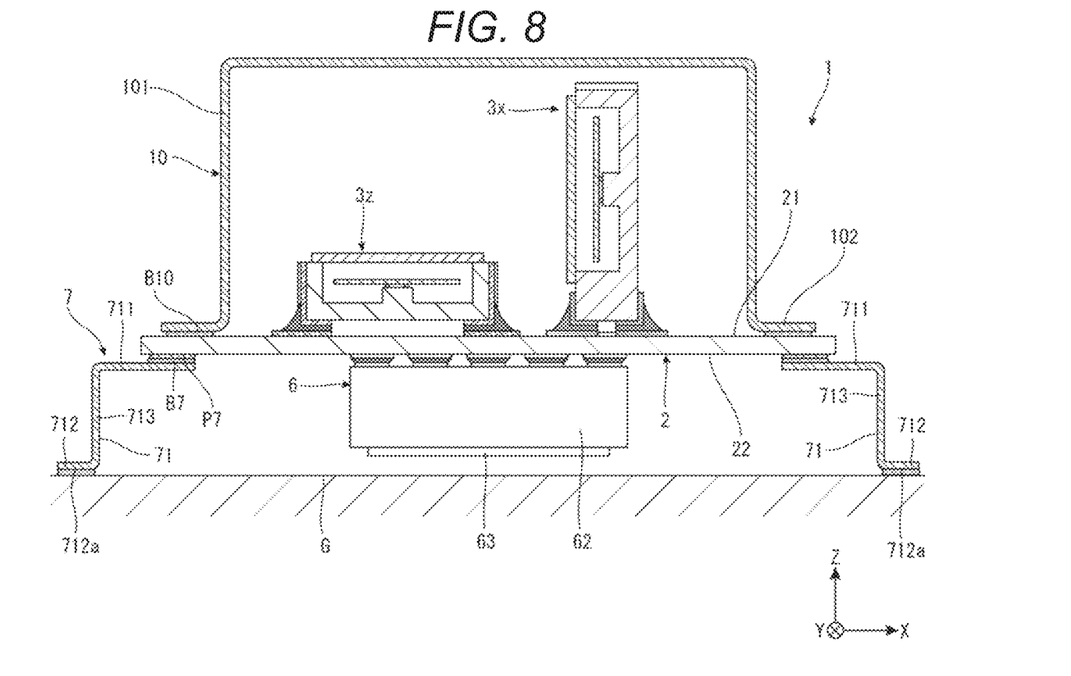
FIG. 8 is a sectional view showing a state in which the electronic device is mounted.
Figure 9:
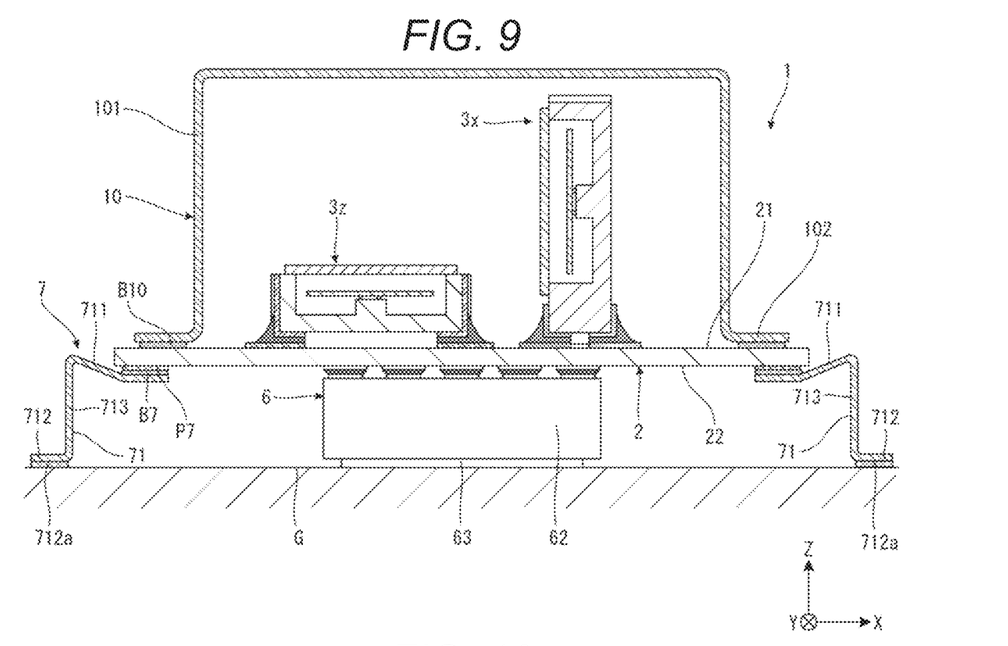
FIG. 9 is a sectional view showing a state in which leads are deformed and a first electronic component contacts a mounting surface.
Figure 10:
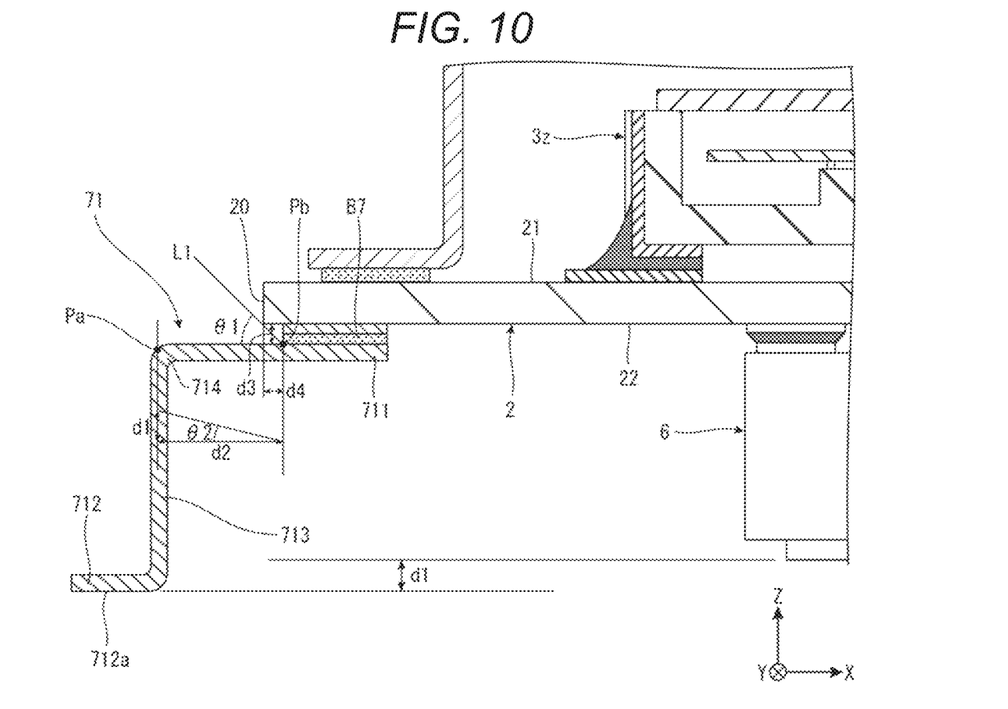
FIG. 10 is a partially enlarged sectional view of a lead part of the electronic device.
Figure 11:
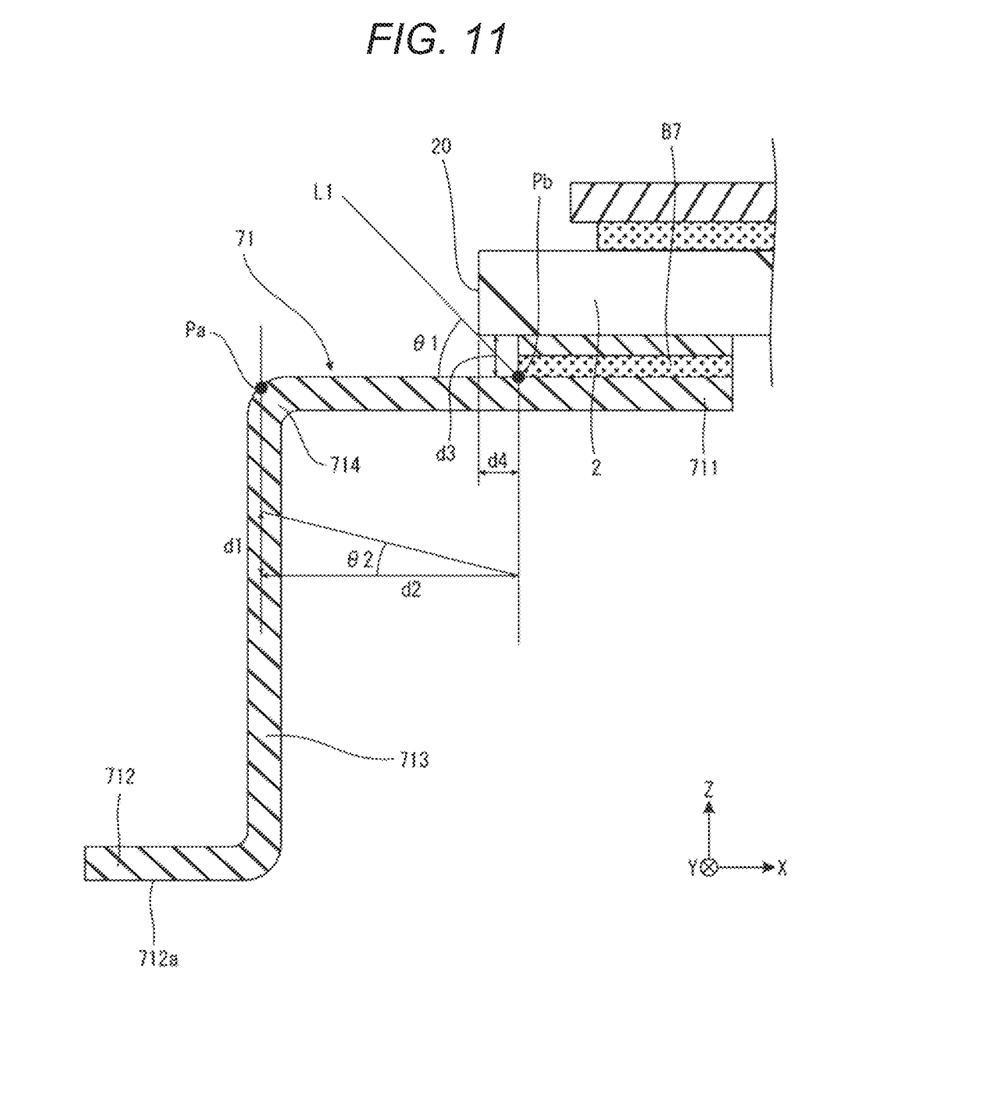
FIG. 11 is a partially enlarged sectional view of the lead part of the electronic device.

FIG. 1 is a top view of an electronic device according to a first embodiment. FIG. 2 is a top view of the electronic device from which a cap is omitted. FIG. 3 is a bottom view of the electronic device. FIG. 4 is a sectional view of a second electronic component. FIG. 5 is a sectional view of a third electronic component. FIG. 6 is a sectional view of a fourth electronic component. FIG. 7 is a sectional view along line A-A in FIG. 2. FIG. 8 is a sectional view showing a state in which the electronic device is mounted. FIG. 9 is a sectional view showing a state in which leads are deformed and a first electronic component contacts a mounting surface. FIGS. 10 and 11 are respectively partially enlarged sectional views of a lead part of the electronic device.

An electronic device 1 shown in FIGS. 1 to 3 has a QFP (Quad Flat Package) structure. Further, the electronic device 1 includes a substrate 2, a second electronic component 3z, a third electronic component 3x, and a fourth electronic component 3y joined to an upper surface 21 of the substrate 2, a first electronic component 6 joined to a lower surface 22 of the substrate 2, a lead group 7 having a plurality of leads 71 joined to the lower surface 22 of the substrate 2, and a cap 10 placed on the substrate 2 to cover the second electronic component 3z, the third electronic component 3x, and the fourth electronic component 3y.

The substrate 2 has a nearly square plate shape in a plan view and has the upper surface 21 as a first surface and the lower surface 22 as a second surface having a front-back relation with each other. The substrate 2 is a ceramic substrate and formed using various ceramic materials such as alumina and titania. Thereby, the substrate 2 having a higher corrosion resistance and a higher mechanical strength is obtained. Further, the substrate has a resistance to moisture absorption and a higher heat resistance and, for example, is hard to be damaged by heat applied in the manufacture of the electronic device 1. For example, the substrate 2 is manufactured by stacking of a plurality of ceramic sheets (green sheets) with predetermined wiring patterns formed thereon and sintering of the stacked structure. Note that the substrate 2 is not limited to the ceramic substrate, but e.g., various semiconductor substrates, various glass substrates, various printed boards, etc. may be used.

As shown in FIG. 2, on the upper surface 21 of the substrate 2, terminals P3z electrically coupled to the second electronic component 3z, terminals P3x electrically coupled to the third electronic component 3x, and terminals P3y electrically coupled to the fourth electronic component 3y are formed. On the other hand, as shown in FIG. 3, on the lower surface 22 of the substrate 2, terminals P6 electrically coupled to the first electronic component 6 and terminals P7 electrically coupled to the lead group 7 are formed. These respective terminals P3z, P3x, P3y, P6, P7 are electrically coupled via wires (not shown) formed on the substrate 2.

The second, third, fourth electronic components 3z, 3x, 3y are respectively packaged surface-mounted components. Thereby, a higher mechanical strength than mounted components with exposed elements may be exerted. Further, mounting of the second, third, fourth electronic components 3z, 3x, 3y on the substrate 2 is easier.

In the embodiment, the second, third, fourth electronic components 3z, 3x, 3y are respectively angular velocity sensors. The second electronic component 3z detects an angular velocity around the Z-axis, the third electronic component 3x detects an angular velocity around the X-axis, and the fourth electronic component 3y detects an angular velocity around the Y-axis. Thereby, the electronic device 1 may respectively independently detect the angular velocities around the three axes orthogonal to one another.

The second, third, fourth electronic components 3z, 3x, 3y have the same basic configuration as one another and are mounted so that attitudes may be orthogonal to one another with detection axes directed along the X-axis, the Y-axis, and the Z-axis. As shown in FIGS. 4 to 6, each of the second, third, fourth electronic components 3z, 3x, 3y has a package 31 and a vibrator element 34 housed in the package 31. The package 31 has a recessed portion and includes a box-shaped base 32 supporting the vibrator element 34 housed in the recessed portion, and a lid 33 joined to the base 32 to close the opening of the recessed portion. The base 32 is formed using a ceramic material such as alumina and the lid 33 is formed using a metal material such as kovar.

For example, the vibrator element 34 is a quartz crystal vibrator element having a drive arm and a vibrating arm. In the quartz crystal vibrator element, when an angular velocity around a detection axis is applied while a drive signal is applied and the drive arm is driven and vibrated, a detection vibration is excited in a detection arm by a Coriolis force. Then, electric charge generated in the detection arm by the detection vibration is extracted as a detection signal and the angular velocity may be obtained based on the extracted detection signal.

As shown in FIG. 4, the second electronic component 3z is joined to the upper surface 21 of the substrate 2 via conductive joint members B3z on the bottom surface of the package 31. Terminals 35 electrically coupled to the detection element 34 are formed on the bottom surface of the package 31 and the terminals 35 are electrically coupled to the terminals P3z via the joint members B3z. Further, as shown in FIG. 5, the third electronic component 3x is joined to the upper surface 21 of the substrate 2 via conductive joint members B3x on the side surface of the package 31. Terminals 35 electrically coupled to the detection element 34 are formed on the side surface of the package 31 and the terminals 35 are electrically coupled to the terminals P3x via the joint members B3x. Furthermore, as shown in FIG. 6, the fourth electronic component 3y is joined to the upper surface 21 of the substrate 2 via conductive joint members B3y on the side surface of the package 31. Terminals 35 electrically coupled to the detection element 34 are formed on the side surface of the package 31 and the terminals 35 are electrically coupled to the terminals P3y via the joint members B3y.

The joint members B3z, B3x, B3y are respectively solders and mechanically and electrically couple the second, third, fourth electronic components 3z, 3x, 3y and the substrate 2 by solder reflow. Thereby, mounting of the second, third, fourth electronic components 3z, 3x, 3y on the substrate 2 may be easily and accurately performed. Note that the joint members B3z, B3x, B3y are not limited to the solders, but, e.g., various brazing members such as gold brazing and silver brazing, various metal bumps such as gold bumps and silver bumps, various conductive adhesives in which conductive filler is dispersed in resin adhesives, or the like may be used.

As above, the second, third, fourth electronic components 3z, 3x, 3y are explained, however, the configurations thereof are not particularly limited. For example, the vibrator element 34 may include a capacitive silicon vibrator element and detect an angular velocity based on a change in capacitance. Further, at least one of the second, third, fourth electronic components 3z, 3x, 3y may have another configuration than the others. Furthermore, the second, third, fourth electronic components 3z, 3x, 3y are not necessarily the packaged surface-mounted components. For example, the package 31 may be omitted and the vibrator element 34 may be exposed in the cap 10. The second, third, fourth electronic components 3z, 3x, 3y may be physical quantity sensors detecting other physical quantities than the angular velocities or not physical quantity sensors. At least one of the second, third, fourth electronic components 3z, 3x, 3y may be omitted.

As shown in FIG. 7, the cap 10 is joined to the upper surface 21 of the substrate 2 and houses the second, third, fourth electronic components 3z, 3x, 3y between the substrate 2 and itself. The cap 10 has a hat shape and includes a base portion 101 having a recessed part opening to the lower surface and an annular flange portion 102 projecting from the lower end part of the base portion 101 toward the outer circumference. The cap 10 is placed on the upper surface 21 of the substrate 2 to house the second, third, fourth electronic components 3z, 3x, 3y in the base portion 101, and the flange portion 102 is joined to the upper surface 21 via joint members B10. The interior of the cap 10 is air-tightly sealed.

The cap 10 housing the second, third, fourth electronic components 3z, 3x, 3y is provided, and thereby, the second, third, fourth electronic components 3z, 3x, 3y may be protected from moisture, dust, impact, etc. Note that, in the embodiment, the interior of the cap 10 is atmospherically sealed, however, not limited to that. For example, the cap 10 may be negative pressure-sealed or positive pressure-sealed, or the air may be replaced by a stable gas such as nitrogen or argon.

The cap 10 has conductivity and is formed using e.g., a metal material. Particularly, in the embodiment, the cap 10 is formed using Alloy 42 as an iron-nickel alloy. Thereby, a difference in coefficient of linear expansion between the substrate 2 as the ceramic substrate and the cap 10 may be made sufficiently small, and thermal stress due to the difference in coefficient of linear expansion may be effectively suppressed. Therefore, the electronic device 1 having stable characteristics less susceptible to the environment temperature is obtained.

Furthermore, the cap 10 is coupled to the ground when the electronic device 1 is used. Thereby, the cap 10 functions as a shield shielding external electromagnetic noise and driving of the second, third, fourth electronic components 3z, 3x, 3y housed inside of the cap 10 is further stabilized. Note that the material of the cap 10 is not limited to the alloy 42, but, e.g., metal materials such as an SUS material, various ceramic materials, various resin materials, semiconductor materials such as silicon, various glass materials, etc. may be used.

The first electronic component 6 is a packaged surface-mounted component. Thereby, a higher mechanical strength than mounted components with exposed elements may be exerted. Further, mounting of the first electronic component 6 on the substrate 2 is easier.

As shown in FIG. 7, the first electronic component 6 has a package 61 and an acceleration sensor 4 and a circuit element 5 housed in the package 61. The package 61 has a box-shaped base 62 having a recessed portion and a lid 63 joined to the base 62 to close the opening of the recessed portion. The base 62 is formed using a ceramic material such as alumina and the lid 63 is formed using a metal material such as kovar.

The circuit element 5 and the acceleration sensor 4 are mounted to overlap on the bottom surface of the recessed portion. The circuit element 5 is electrically coupled to internal terminals of the base 62 via bonding wires and the acceleration sensor 4 is electrically coupled to the circuit element 5 via bonding wires. Note that the placement of the acceleration sensor 4 and the circuit element 5 within the package 61 is not particularly limited.

The acceleration sensor 4 is a three-axis acceleration sensor that may respectively independently detect an acceleration in the X-axis directions, an acceleration in the Y-axis directions, and an acceleration in the Z-axis directions. With the sensor, the electronic device 1 is a six-axis compound sensor that can detect angular velocities around the respective axes of the X-axis, the Y-axis, and the Z-axis and accelerations in the respective axial directions. Accordingly, the electronic device 1 that can be mounted on various electronic components and offers higher convenience and has higher demand is obtained.

The acceleration sensor 4 has a package 41 and acceleration detection elements 44, 45, 46 housed in the package 41. The package 41 has a base 42 supporting the acceleration detection elements 44, 45, 46, and a lid 43 joined to the base 42 to house the acceleration detection elements 44, 45, 46 between the base 42 and itself.

Further, the acceleration detection element 44 is an element detecting an acceleration in the X-axis directions, the acceleration detection element 45 is an element detecting an acceleration in the Y-axis directions, and the acceleration detection element 46 is an element detecting an acceleration in the Z-axis directions. These acceleration detection elements 44, 45, 46 are silicon vibrator elements having fixed electrodes fixed to the base 42 and movable electrodes variable relative to the base 42. When an acceleration in the detection axis direction is applied, the movable electrode is displaced relative to the fixed electrode and a capacitance formed between the fixed electrode and the movable electrode changes. Accordingly, changes of the capacitances of the acceleration detection elements 44, 45, 46 may be extracted as detection signals and the accelerations in the respective axial directions may be obtained based on the extracted detection signals.

Note that the configuration of the acceleration sensor 4 is not particularly limited as long as the sensor may exert the function thereof. For example, the acceleration detection elements 44, 45, 46 are not limited to the silicon vibrator elements, but may be e.g., quartz crystal vibrator elements detecting accelerations based on electric charge generated by vibrations. Or, the acceleration detection elements 44, 45, 46 may be respectively housed in different packages.

The circuit element 5 is electrically coupled to the second, third, fourth electronic components 3z, 3x, 3y, the acceleration sensor 4, and the lead group 7. The circuit element 5 has a control circuit 51 for controlling driving of the second, third, fourth electronic components 3z, 3x, 3y and the acceleration sensor 4 and an interface circuit 52 for external communication via the lead group 7. Of the circuits, the control circuit 51 controls driving of the second, third, fourth electronic components 3z, 3x, 3y and the acceleration sensor 4 and detects the angular velocities around the respective axes of the X-axis, the Y-axis, and the Z-axis and accelerations in the respective axial directions based on the detection signals output from the second, third, fourth electronic components 3z, 3x, 3y and the acceleration sensor 4. On the other hand, the interface circuit 52 transmits and receives signals, receives commands from an external apparatus, and outputs the detected angular velocities and accelerations to the external apparatus.

The first electronic component 6 is joined to the lower surface 22 of the substrate 2 via the conductive joint members B6 on the bottom surface of the package 61. Terminals 65 electrically coupled to the circuit element 5 are formed on the bottom surface of the package 61, and the terminals 65 are electrically coupled to the terminals P6 via the joint members B6. The joint members B6 are solders and mechanically and electrically couple the first electronic component 6 and the substrate 2 by solder reflow. Note that the joint members B6 are not limited to the solders, but, e.g., various brazing members such as gold brazing and silver brazing, various metal bumps such as gold bumps and silver bumps, various conductive adhesives in which conductive filler is dispersed in resin adhesives, or the like may be used.

As above, the first electronic component 6 is explained, however, the configuration of the first electronic component 6 is not particularly limited. For example, the package 61 and the acceleration sensor 4 may be omitted and the first electronic component 6 may include only the circuit element 5. In this case, the electronic device 1 functions as a three-axis angular velocity sensor. Or, the package 61 and the circuit element 5 may be omitted. In this case, a circuit having the same function as the circuit element 5 may be provided in an external apparatus electrically coupled to the electronic device 1 and the electronic device 1 may be controlled by the circuit. Or, the package 61 may be omitted and the circuit element 5 and the acceleration sensor 4 may be exposed and mounted on the lower surface 22 of the substrate 2. The first electronic component 6 may be a physical quantity sensor detecting another physical quantity than the acceleration or not a physical quantity sensor.

As shown in FIG. 7, the lead group 7 is located at the lower surface 22 side of the substrate 2 and has the plurality of leads 71 joined to the lower surface 22 of the substrate 2 via conductive joint members B7. Further, the plurality of leads 71 are respectively electrically coupled to the terminals P7 via the joint members B7. As shown in FIGS. 1 and 2, the plurality of leads 71 are provided substantially equally along the four sides of the substrate 2.

The joint members B7 are solders and mechanically and electrically couple the leads 71 and the substrate 2 by solder reflow. Thereby, the leads 71 and the substrate 2 may be easily and accurately coupled. Further, the joint members B7 with less age degradation and higher reliability are obtained. Note that the joint members B7 are not limited to the solders, but, e.g., various brazing members such as gold brazing and silver brazing, various metal bumps such as gold bumps and silver bumps, various conductive adhesives in which conductive filler is dispersed in resin adhesives, or the like may be used.

Here, as shown in FIG. 8, the electronic device 1 is mounted on a smooth mounting surface G via the leads 71. When an impact in the Z-axis direction is applied in the state, as shown in FIG. 9, the leads 71 are elastically deformed until the first electronic component 6 contacts the mounting surface G. If the elastically deformed leads 71 contact the substrate 2, the leads 71 and the substrate 2 may be broken. Accordingly, in the embodiment, the leads 71 are configured not to contact the substrate 2 even when the leads 71 are elastically deformed as shown in FIG. 9. Thereby, breakage of the leads 71 and the substrate 2 may be effectively suppressed and the electronic device 1 with higher mechanical strength and reliability may be obtained.

Particularly, in the embodiment, the leads 71 are not molded, but exposed, and the leads 71 tend to be elastically deformed and tend to be in the state in FIG. 9. Therefore, the effects of the embodiment are exerted more significantly.

Next, the configuration of the lead 71 will be explained in detail. Note that the plurality of leads 71 have the same configuration as one another and, as below, one lead 71 will be representatively explained and the explanation of the other leads 71 will be omitted. The lead 71 to be representatively explained extends along the ZX-plane.

As shown in FIGS. 10 and 11, the lead 71 has a base end portion 711, a distal end portion 712, and a coupling portion 713 coupling the base end portion 711 and the distal end portion 712. The lead 71 is bended in opposite directions and cranked between the base end portion 711 and the coupling portion 713 and between the distal end portion 712 and the coupling portion 713. Of these respective portions, the base end portion 711 is joined to the lower surface 22 of the substrate 2 via the joint member B7. Further, the distal end portion 712 is located at the minus side in the Z-axis direction, i.e., distally from the substrate 2 with respect to the base end portion 711 and has a terminal surface 712a formed by the lower surface thereof. The electronic device 1 is mounted on the mounting surface G on the terminal surface 712a. Further, the base end portion 711 and the distal end portion 712 respectively extend in the X-axis directions and the coupling portion 713 extends along the Z-axis directions. Accordingly, in the plan view from the Z-axis direction, the distal end portion 712 is located outside of the base end portion 711. Note that the methods of extending the base end portion 711, the distal end portion 712, and the coupling portion 713 are respectively not particularly limited.

As seen from the Y-axis direction orthogonal to the XZ-plane along which the lead 71 extends, when an angle formed by a line Li connecting an outermost position Pb in which the joint member B7 contacts the base end portion 711 and an outer edge 20 of the substrate 2 and the base end portion 711 is θ1, a distance between the first electronic component 6 and the terminal surface 712a in the Z-axis direction, i.e., the thickness direction of the substrate 2 is d1, a distance between a boundary part 714 between the base end portion 711 and the coupling portion 713 and the joint member B7 in the X-axis direction, i.e., the direction along the substrate 2 is d2, and arctan(d1/d2)=θ2, a relationship θ1>θ2 is satisfied. Note that, more specifically, θ1 is an angle formed by the line Li and the upper surface, i.e., the surface at the substrate 2 side of the base end portion 711. Further, d2 is a distance between the position Pb and a top point Pa of the boundary part 714 in the X-axis direction. Furthermore, arctan is an inverse function of tan.

The relationship θ1>θ2 is satisfied, and thereby, contact between the lead 71 and the substrate 2 may be suppressed while the lead 71 is elastically deformed into the state in FIG. 9. Accordingly, the breakage of the lead 71 and the substrate 2 may be effectively suppressed and the electronic device 1 with higher mechanical strength and reliability may be obtained.

Note that the relationship θ1>θ2 is not particularly limited as long as the relationship is satisfied. Within the range, θ1/θ2>1.5 is preferable and θ1/θ2>2.0 is more preferable. Thereby, the contact between the lead 71 and the substrate 2 may be suppressed more effectively. Note that, if θ1>θ2 is too large, excessive upsizing of the electronic device 1 may be caused. Accordingly, the upper limit is preferably θ1/θ2≤4.0 and more preferably θ1/θ2≤3.0. Thereby, upsizing of the electronic device 1 may be suppressed and the above described effects may be exerted.

Particularly, in the embodiment, the joint member B7 is located at the inner side than the outer edge 20 of the substrate 2. The joint member B7 is located at the inner side than the outer edge 20 of the substrate 2, and thereby, for example, in the manufacture of the electronic device 1, misregistration of the substrate 2 and the lead group 7 is easily tolerated. In the configuration, when a distance between the substrate 2 and the base end portion 711 in the Z-axis direction, i.e., the thickness direction of the substrate 2 is d3 and a distance between the outer edge 20 of the substrate 2 and the joint member B7 in the X-axis direction, i.e., the direction along the substrate 2 is d4, a relationship d1/d2<d3/d4 is satisfied. arctan(d3/d4)=θ1 and arctan(d1/d2)=θ2 and the relationship d1/d2<d3/d4 is satisfied, and thereby, θ1>θ2 may be satisfied more reliably. Note that, more specifically, d4 is a distance between the outer edge 20 and the position Pb of the joint member B7.

As above, the electronic device 1 of the embodiment is explained. As described above, the electronic device 1 includes the substrate 2 having the upper surface 21 as the first surface and the lower surface 22 as the second surface in the front-back relation with each other, the first electronic component 6 mounted on the lower surface 22, and the lead 71 located at the lower surface 22 side of the substrate 2 and joined to the lower surface 22 via the conductive joint member B7. Further, the lead 71 has the base end portion 711 extending in the direction along the substrate 2 and joined to the lower surface 22 via the joint member B7, the distal end portion 712 located distally from the substrate 2 in the thickness direction of the substrate 2 with respect to the base end portion 711 and having the terminal surface 712a, and the coupling portion 713 coupling the base end portion 711 and the distal end portion 712. As seen from the direction orthogonal to the plane along which the lead 71 extends, when the angle formed by the line Li connecting the outermost position Pb in which the joint member B7 contacts the base end portion 711 and the outer edge 20 of the substrate 2 and the base end portion 711 is θ1, the distance between the first electronic component 6 and the terminal surface 712a in the thickness direction of the substrate 2, i.e., the Z-axis direction is d1, the distance between the boundary part between the base end portion 711 and the coupling portion 713 and the joint member B7 in the direction along the substrate 2 is d2, and arctan(d1/d2)=θ2, θ1>θ2 is satisfied. According to the configuration, the contact between the lead 71 and the substrate 2 may be suppressed while the lead 71 is elastically deformed into the state in FIG. 9. Therefore, the breakage of the lead 71 and the substrate 2 may be effectively suppressed and the electronic device 1 with higher mechanical strength and reliability may be obtained.

As described above, when the joint member B7 is located at the inner side than the outer edge 20 of the substrate 2, the distance between the substrate 2 and the base end portion 711 in the thickness direction of the substrate 2 is d3, and the distance between the outer edge 20 of the substrate 2 and the joint member B7 in the direction along the substrate 2 is d4, d1/d2<d3/d4 is satisfied. The relationship is satisfied, and thereby, θ1>θ2 may be satisfied more reliably.

As described above, the base end portion 711 is exposed. Accordingly, the lead 71 is readily elastically deformed. Therefore, the above described effect of suppressing the contact between the lead 71 and the substrate 2 is exerted more significantly.

As described above, the second electronic component 3z mounted on the upper surface 21 and the cap 10 joined to the upper surface 21 and housing the second electronic component 3z between the substrate 2 and itself are provided. Thereby, the upper surface 21 side of the substrate 2 may be effectively used. Further, the second electronic component 3z may be protected by the cap 10.

Second Embodiment

Figure 12:
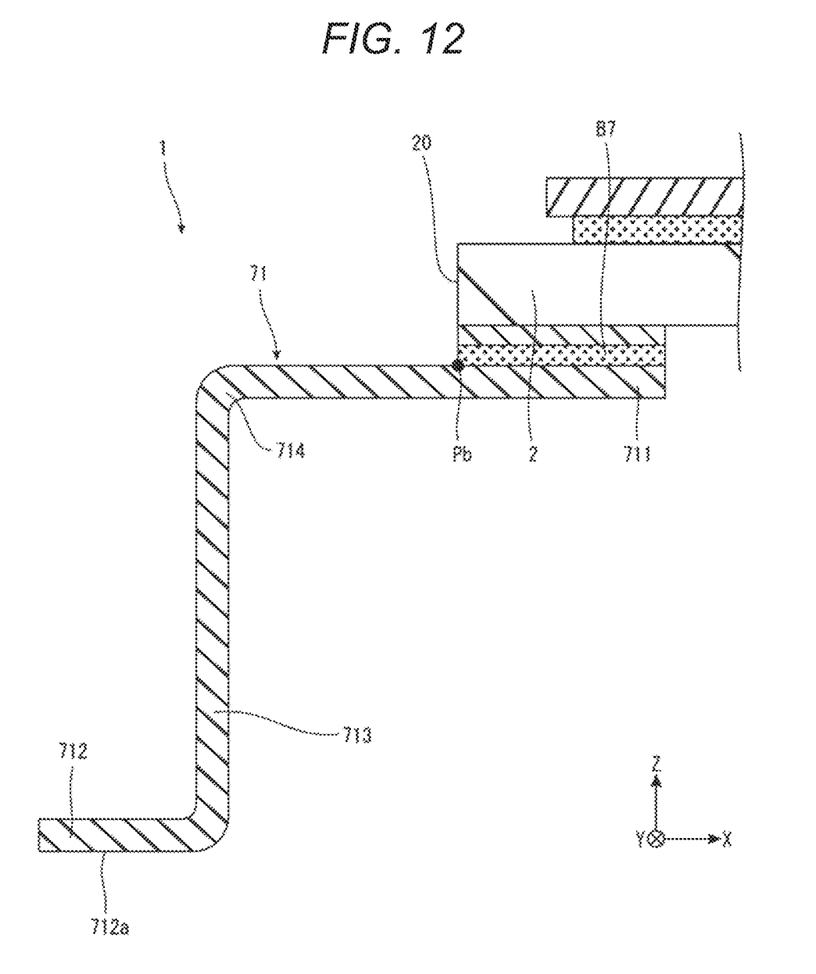
FIG. 12 is a partially enlarged sectional view of a lead part of an electronic device according to a second embodiment.

FIG. 12 is a partially enlarged sectional view of a lead part of an electronic device according to a second embodiment.

The embodiment is the same as the above described first embodiment except that the placement of the joint member B7 is different. Note that, in the following description, the embodiment will be explained with a focus on the differences from the above described embodiment and the explanation of the same items will be omitted. Further, in the drawing of the embodiment, the same configurations as those of the above described embodiment have the same signs.

As shown in FIG. 12, in the electronic device 1 of the embodiment, the joint member B7 overlaps with the outer edge 20 of the substrate 2 in the plan view in the Z-axis direction. Particularly, in the embodiment, the position Pb overlaps with the outer edge 20 of the substrate 2 in the plan view in the Z-axis direction. The lead 71 is elastically deformed at a point of support near the position Pb. The position Pb overlaps with the outer edge 20 of the substrate 2, and thereby, the point of support of the elastic deformation may be located at the outer side. Accordingly, the contact between the lead 71 and the substrate 2 may be suppressed more effectively.

As described above, in the electronic device 1 of the embodiment, the joint member B7 overlaps with the outer edge 20 of the substrate 2 in the plan view of the substrate 2. Thereby, the contact between the lead 71 and the substrate 2 may be suppressed more effectively.

According to the second embodiment as well, the same effects as those of the above described first embodiment may be exerted.

Third Embodiment

Figure 13:
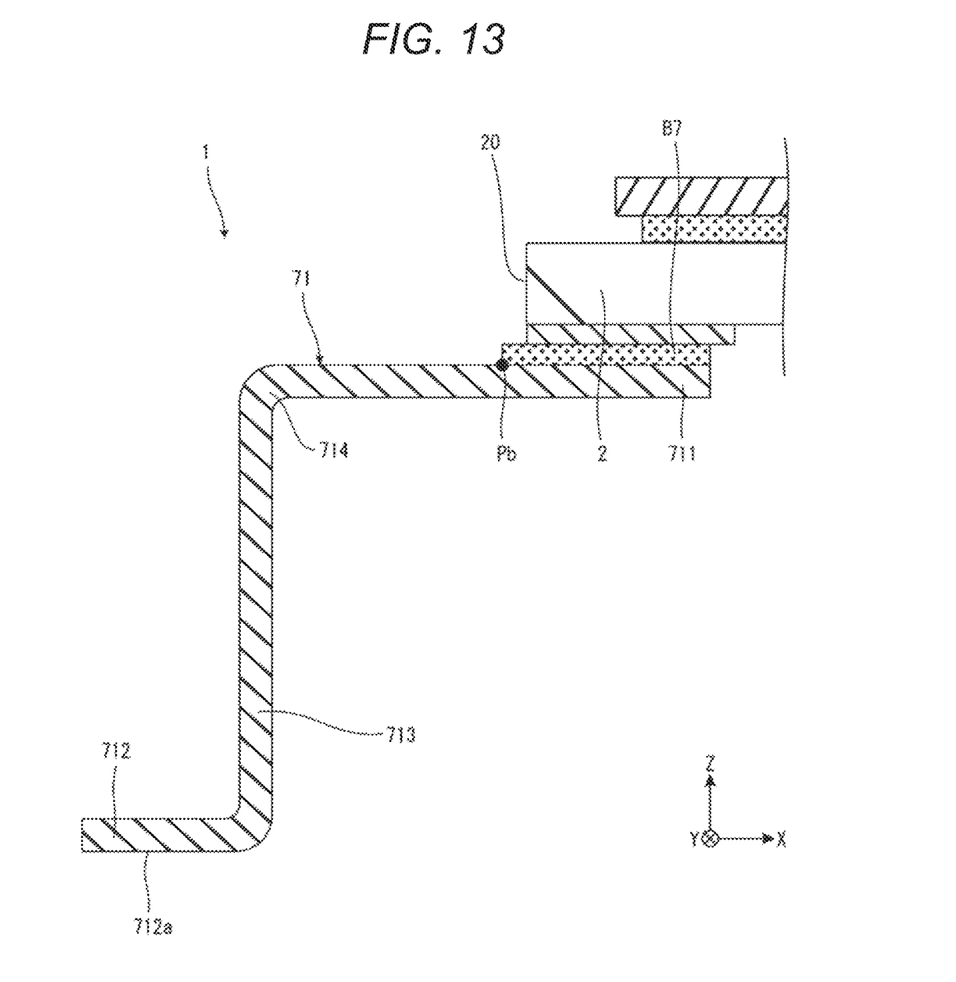
FIG. 13 is a partially enlarged sectional view of a lead part of an electronic device according to a third embodiment.

FIG. 13 is a partially enlarged sectional view of a lead part of an electronic device according to a third embodiment.

The embodiment is the same as the above described first embodiment except that the placement of the joint member B7 is different. Note that, in the following description, the embodiment will be explained with a focus on the differences from the above described embodiments and the explanation of the same items will be omitted. Further, in the drawing of the embodiment, the same configurations as those of the above described embodiments have the same signs.

As shown in FIG. 13, in the electronic device 1 of the embodiment, the joint member B7 overlaps with the outer edge 20 of the substrate 2 in the plan view in the Z-axis direction. Particularly, in the embodiment, the position Pb is located at the outer side than the outer edge 20 of the substrate 2 in the plan view in the Z-axis direction. The lead 71 is elastically deformed at a point of support near the position Pb. The position Pb is located at the outer side than the outer edge 20 of the substrate 2, and thereby, the point of support of the elastic deformation may be located at the outer side. Accordingly, the contact between the lead 71 and the substrate 2 may be suppressed more effectively.

As described above, in the electronic device 1 of the embodiment, the joint member B7 overlaps with the outer edge 20 of the substrate 2 in the plan view of the substrate 2. Thereby, the contact between the lead 71 and the substrate 2 may be suppressed more effectively.

According to the third embodiment as well, the same effects as those of the above described first embodiment may be exerted.

Fourth Embodiment

Figure 14:
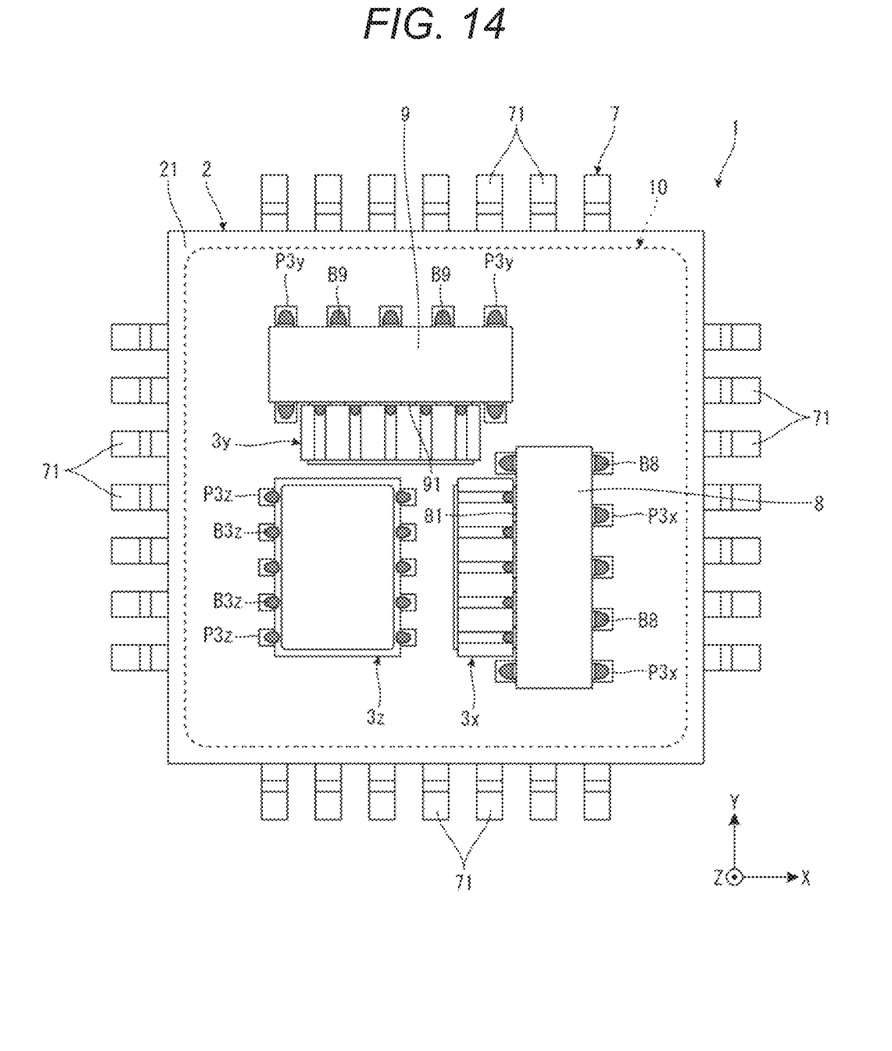
FIG. 14 is a top view of an electronic device according to a fourth embodiment from which a cap is omitted.
Figure 15:
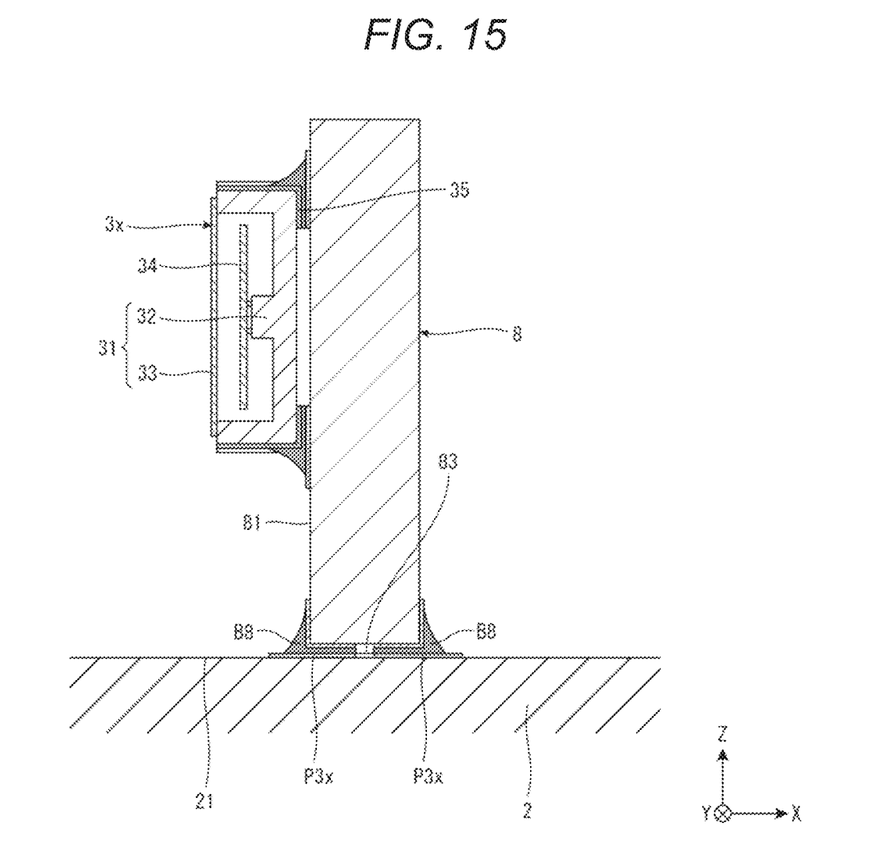
FIG. 15 is a sectional view of a first supporting substrate.
Figure 16:
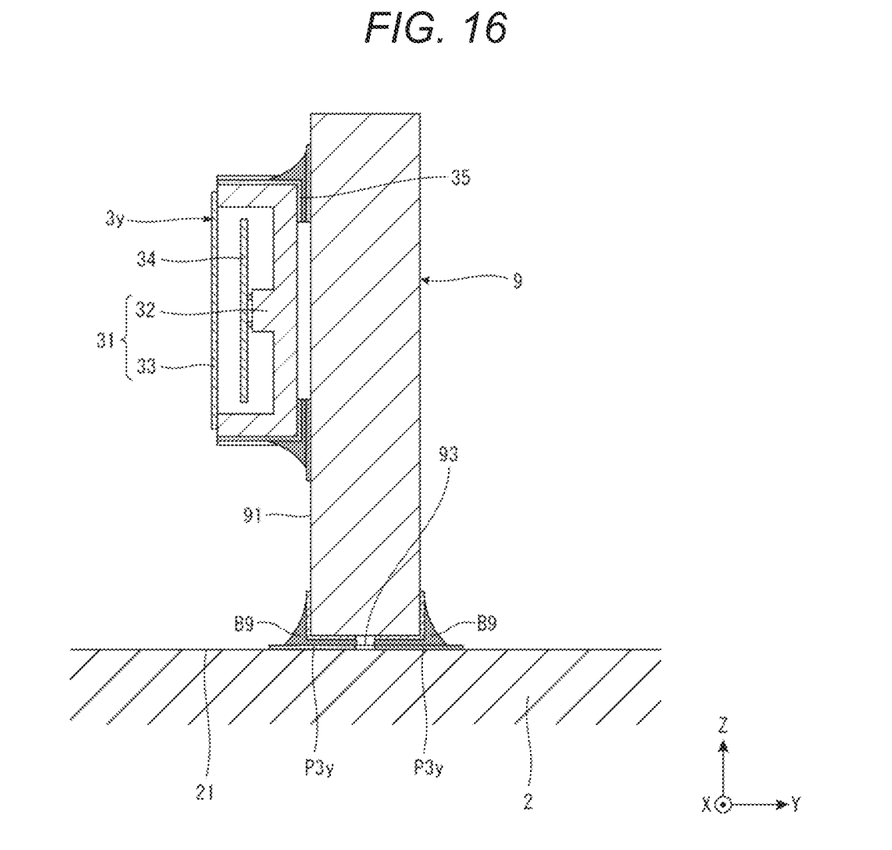
FIG. 16 is a sectional view of a second supporting substrate.

FIG. 14 is a top view of an electronic device according to a fourth embodiment from which a cap is omitted. FIG. 15 is a sectional view of a first supporting substrate. FIG. 16 is a sectional view of a second supporting substrate.

The embodiment is the same as the above described first embodiment except that the method of joining the third, fourth electronic components 3x, 3y to the substrate 2 is different. Note that, in the following description, the embodiment will be explained with a focus on the differences from the above described embodiments and the explanation of the same items will be omitted. Further, in the respective drawings of the embodiment, the same configurations as those of the above described embodiments have the same signs.

As shown in FIG. 14, the electronic device 1 further has a first supporting substrate 8 and a second supporting substrate 9. Further, the third electronic component 3x is joined to the substrate 2 via the first supporting substrate 8, and the fourth electronic component 3y is joined to the substrate 2 via the second supporting substrate 9.

The first supporting substrate 8 is an interposer substrate intervening in the mounting of the third electronic component 3x on the substrate 2, and the second supporting substrate 9 is an interposer substrate intervening in the mounting of the fourth electronic component 3y on the substrate 2. That is, the third electronic component 3x is mechanically joined to the substrate 2 and electrically coupled to the substrate 2 via the first supporting substrate 8. Similarly, the fourth electronic component 3y is mechanically joined to the substrate 2 and electrically coupled to the substrate 2 via the second supporting substrate 9. These first, second supporting substrates 8, 9 have the same configuration as each other. Thereby, it is not necessary to separately prepare the first, second supporting substrates 8, 9 and the manufacturing cost of the electronic device 1 may be reduced.

Further, both of the first, second supporting substrates 8, 9 are ceramic substrates and formed using various ceramic materials such as alumina and titania. Thereby, the first, second supporting substrates 8, 9 having higher corrosion resistances and higher mechanical strengths are obtained. Further, the substrates have resistances to moisture absorption and higher heat resistances and, for example, are hard to be damaged by heat applied in the manufacture of the electronic device 1. Here, the first, second supporting substrates 8, 9 are manufactured by stacking of pluralities of ceramic sheets with predetermined wiring patterns formed thereon and sintering of the stacked structures. Note that the first, second supporting substrates 8, 9 are not limited to the ceramic substrates, but e.g., various semiconductor substrates, various glass substrates, various printed boards, etc. may be used.

As shown in FIG. 15, the first supporting substrate 8 has a nearly square plate shape in the plan view and has a principal surface 81 to which the third electronic component 3x is joined and a side surface 83 joined to the upper surface 21 of the substrate 2. The first supporting substrate 8 is joined to the upper surface 21 of the substrate 2 via a plurality of conductive joint members B8 on the side surface 83 in a standing position with the principal surface 81 directed toward the X-axis direction and the side surface 83 directed downward. Further, the first supporting substrate 8 is electrically coupled to the terminals P3x via the joint members B8.

As shown in FIG. 16, like the above described first supporting substrate 8, the second supporting substrate 9 has a nearly square plate shape in the plan view and has a principal surface 91 to which the fourth electronic component 3y is joined and a side surface 93 joined to the upper surface 21 of the substrate 2. The second supporting substrate 9 is joined to the upper surface 21 of the substrate 2 via a plurality of conductive joint members B9 on the side surface 93 in a standing position with the principal surface 91 directed toward the Y-axis direction and the side surface 93 directed downward. Further, the second supporting substrate 9 is electrically coupled to the terminals P3y via the joint members B9.

The joint members B8, B9 are solders and mechanically and electrically couple the first, second supporting substrates 8, 9 and the substrate 2 by solder reflow. Thereby, mounting of the first, second supporting substrates 8, 9 on the substrate 2 may be easily and accurately performed. Note that the joint members B8, B9 are not limited to the solders, but, e.g., various brazing members such as gold brazing and silver brazing, various metal bumps such as gold bumps and silver bumps, various conductive adhesives in which conductive filler is dispersed in resin adhesives, or the like may be used.

Here, the side surface 83 of the first supporting substrate 8 is sufficiently smoothed. Specifically, the side surface 83 has smaller surface roughness than the side surface of the base 32 of the third electronic component 3x. Further, the side surface 83 has an inclination controlled with higher accuracy and is orthogonal to the principal surface 81. The first supporting substrate 8 has a smaller individual difference than the base 32. Specifically, an average value of amounts of differences of angles formed by the principal surfaces 81 and the side surfaces 83 of a predetermined number of randomly chosen first supporting substrates 8 from 90° is smaller than an average value of amounts of differences of angles formed by the bottom surfaces and the side surfaces of the same number of randomly chosen bases 32 from 90°. Thereby, compared to a case where the third electronic component 3x is directly joined to the substrate 2 without intervening by the first supporting substrate 8 like the above described first embodiment, a shift in attitude of the third electronic component 3x may be made smaller.

Similarly, the side surface 93 of the second supporting substrate 9 is sufficiently smoothed. Further, the side surface 93 has an inclination controlled with higher accuracy and is orthogonal to the principal surface 91. The second supporting substrate 9 has a smaller individual difference than the base 32. Thereby, compared to a case where the fourth electronic component 3y is directly joined to the substrate 2 without intervening by the second supporting substrate 9 like the above described first embodiment, a shift in attitude of the fourth electronic component 3y may be made smaller.

As described above, the electronic device 1 of the embodiment includes the first supporting substrate 8 having the side surface 83 joined to the upper surface 21, the third electronic component 3x joined to the principal surface 81 of the first supporting substrate 8, the second supporting substrate 9 having the side surface 93 joined to the upper surface 21, and the fourth electronic component 3y joined to the principal surface 91 of the second supporting substrate 9. Thereby, shifts in attitude of the third, fourth electronic components 3x, 3y on the substrate 2 may be suppressed.

According to the fourth embodiment as well, the same effects as those of the above described first embodiment may be exerted.

As above, the electronic device of the present disclosure is explained based on the illustrated embodiments, however, the present disclosure is not limited to those. The configurations of the respective parts may be replaced by any configurations having the same functions. Further, any other configuration may be added to the present disclosure. Furthermore, the respective embodiments may be appropriately combined.

What is claimed is:
1. An electronic device comprising:
a substrate having a first surface and a second surface in a front-back relation with each other;
a first electronic component mounted on the second surface; and
a lead located at the second surface side of the substrate and joined to the second surface via a conductive joint member, wherein
the lead includes a base end portion extending in a direction along the substrate and joined to the second surface via the joint member, a distal end portion located distally from the substrate with respect to the base end portion in a thickness direction of the sub- strate and having a terminal surface, and a coupling portion coupling the base end portion and the distal end portion, and θ1>θ2, wherein, as seen from a direction orthogonal to a plane along which the lead extends, an angle formed by a line connecting an outermost position in which the joint member contacts the base end portion and an outer edge of the substrate and the base end portion is θ1, a distance between the first electronic component and the terminal surface in the thickness direction of the substrate is d1, a distance between a boundary part between the base end portion and the coupling portion and the joint member in the direction along the substrate is d2, and arctan(d1/d2)=θ2.

2. The electronic device according to claim 1, wherein the joint member is located at an inner side than the outer edge of the substrate, and d1/d2<d3/d4, wherein a distance between the substrate and the base end portion in the thickness direction of the substrate is d3, and a distance between the outer edge of the substrate and the joint member in the direction along the substrate is d4.

3. The electronic device according to claim 1, wherein the base end portion is exposed.

4. The electronic device according to claim 1, further comprising:
 a second electronic component mounted on the first surface; and
 a cap joined to the first surface and housing the second electronic component between the substrate and itself.

5. The electronic device according to claim 1, further comprising:
 a first supporting substrate having a side surface joined to the first surface;
 a third electronic component joined to a principal surface of the first supporting substrate;
 a second supporting substrate having a side surface joined to the first surface; and
 a fourth electronic component joined to a principal surface of the second supporting substrate.

6. The electronic device according to claim 1, wherein the joint member overlaps with the outer edge of the substrate.

* * * * *